US012656061B2

(12) United States Patent
Yamaguchi

(10) Patent No.: US 12,656,061 B2
(45) Date of Patent: Jun. 16, 2026

(54) SUBSTRATE PROCESSING METHOD AND SUBSTRATE PROCESSING APPARATUS

(71) Applicant: SCREEN Holdings Co., Ltd., Kyoto (JP)

(72) Inventor: Yuji Yamaguchi, Kyoto (JP)

(73) Assignee: SCREEN HOLDINGS CO., LTD. (JP)

( * ) Notice: Subject to any disclaimer, the term of this patent is extended or adjusted under 35 U.S.C. 154(b) by 902 days.

(21) Appl. No.: 17/912,614

(22) PCT Filed: Jan. 13, 2021

(86) PCT No.: PCT/JP2021/000812
§ 371 (c)(1),
(2) Date: Sep. 19, 2022

(87) PCT Pub. No.: WO2021/199565
PCT Pub. Date: Oct. 7, 2021

(65) Prior Publication Data
US 2023/0184487 A1 Jun. 15, 2023

(30) Foreign Application Priority Data
Mar. 30, 2020 (JP) ................................. 2020-059493

(51) Int. Cl.
*F26B 7/00* (2006.01)
*F26B 3/18* (2006.01)
(Continued)

(52) U.S. Cl.
CPC .................. *F26B 7/00* (2013.01); *F26B 3/18* (2013.01); *F26B 5/005* (2013.01); *H10P 70/20* (2026.01); *H10P 70/80* (2026.01)

(58) Field of Classification Search
CPC .... F26B 7/00; F26B 3/18; F26B 5/005; H01L 21/02057; H01L 21/02101;
(Continued)

(56) References Cited

U.S. PATENT DOCUMENTS

| | | | | |
|---|---|---|---|---|
| 2004/0003831 A1* | 1/2004 | Mount | ..................... | B01J 3/008 134/30 |
| 2004/0221875 A1 | 11/2004 | Saga et al. | ...................... | 134/26 |

(Continued)

FOREIGN PATENT DOCUMENTS

| | | |
|---|---|---|
| CN | 1571122 A | 1/2005 |
| CN | 105590836 A | 5/2016 |

(Continued)

OTHER PUBLICATIONS

International Search Report mailed Mar. 30, 2021 in corresponding PCT International Application No. PCT/JP2021/000812.
(Continued)

*Primary Examiner* — Jessica Yuen
(74) *Attorney, Agent, or Firm* — OSTROLENK FABER LLP

(57) ABSTRACT

A substrate processing method of the invention includes: a first step of introducing a processing fluid in a gas phase into a chamber housing a substrate; a second step of changing the processing fluid in the chamber from the gas phase to a supercritical state without intervention of a liquid phase; a third step of changing the processing fluid in the chamber from the supercritical state to a liquid phase; a fourth step of changing the processing fluid in the chamber from the liquid phase to a supercritical state; and a fifth step of changing the processing fluid in the chamber from the supercritical state to a gas phase without intervention of a liquid phase and discharging the processing fluid from the chamber.

11 Claims, 7 Drawing Sheets

(51) Int. Cl.
　　*F26B 5/00*　　　　(2006.01)
　　*H10P 70/00*　　　(2026.01)
(58) Field of Classification Search
　　CPC ......... H01L 21/67034; H01L 21/67748; H01L
　　　　　　21/67103; H10P 70/20; H10P 70/80;
　　　　　　H10P 72/0408; H10P 72/3306; H10P
　　　　　　　　　　　　　　　72/0432
　　See application file for complete search history.

(56) References Cited

U.S. PATENT DOCUMENTS

| | | | |
|---|---|---|---|
| 2011/0220152 A1* | 9/2011 | Kitajima ........... | H01L 21/67028 |
| | | | 134/26 |
| 2011/0247662 A1 | 10/2011 | Kamikawa ................... | 134/105 |
| 2012/0240426 A1 | 9/2012 | Hayashi et al. ................ | 34/351 |
| 2013/0333726 A1 | 12/2013 | Goshi ............................ | 134/18 |
| 2016/0133454 A1 | 5/2016 | Lee et al. | |
| 2017/0098541 A1 | 4/2017 | Gouk et al. | |
| 2018/0096863 A1 | 4/2018 | Goshi et al. | |
| 2018/0323076 A1 | 11/2018 | Yao et al. | |

FOREIGN PATENT DOCUMENTS

| | | | |
|---|---|---|---|
| CN | 108352314 A | 7/2018 |
| JP | 2003173997 A | 6/2003 |
| JP | 2003282510 A | 10/2003 |
| JP | 2004-128456 A | 4/2004 |
| JP | 2004-158591 A | 6/2004 |
| JP | 2011222697 A | 11/2011 |
| JP | 2014-022520 A | 2/2014 |
| JP | 2018060895 A | 4/2018 |
| JP | 2018531511 A | 10/2018 |

OTHER PUBLICATIONS

Written Opinion mailed Mar. 30, 2021 in corresponding PCT International Application No. PCT/JP2021/000812.

Office Action dated Feb. 16, 2024 in corresponding Korean Patent Application No. 10-2022-7030848 with English translation.

Office Action for the corresponding Chinese Patent Application No. 202180021242.7, issued on Dec. 25, 2025, with its English translation.

* cited by examiner

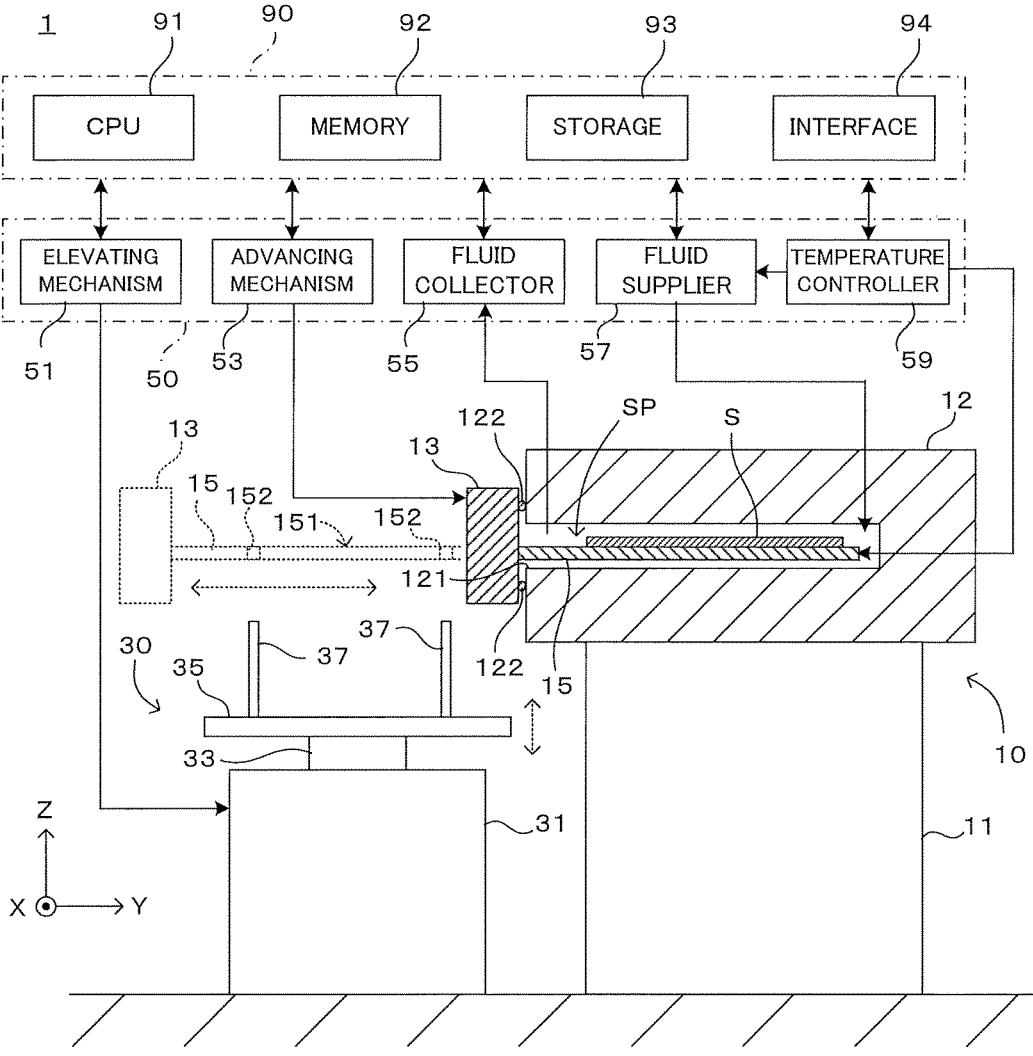
F I G.  1

F I G. 2

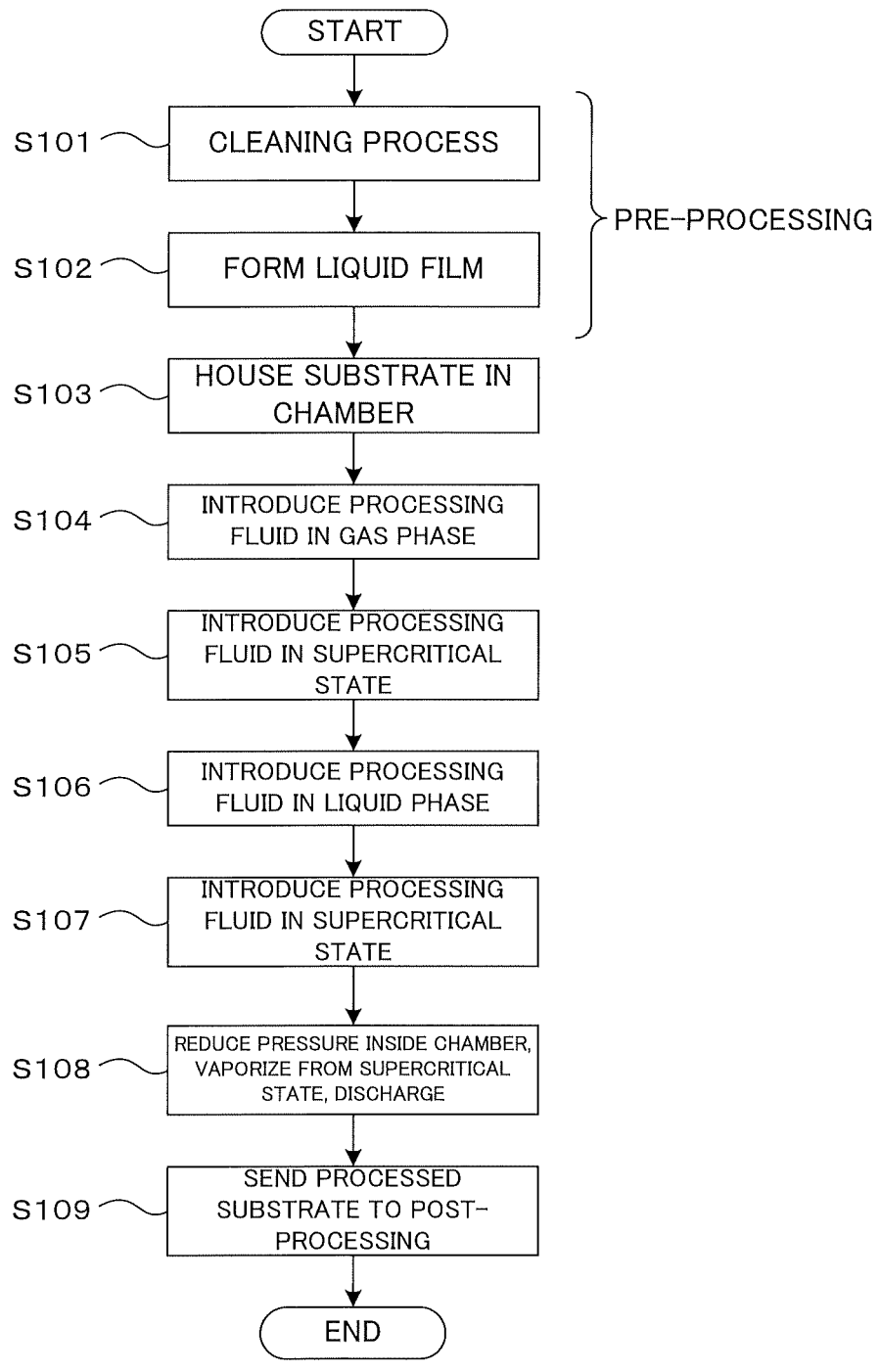

START

S101 — CLEANING PROCESS

S102 — FORM LIQUID FILM

PRE-PROCESSING

S103 — HOUSE SUBSTRATE IN CHAMBER

S104 — INTRODUCE PROCESSING FLUID IN GAS PHASE

S105 — INTRODUCE PROCESSING FLUID IN SUPERCRITICAL STATE

S106 — INTRODUCE PROCESSING FLUID IN LIQUID PHASE

S107 — INTRODUCE PROCESSING FLUID IN SUPERCRITICAL STATE

S108 — REDUCE PRESSURE INSIDE CHAMBER, VAPORIZE FROM SUPERCRITICAL STATE, DISCHARGE

S109 — SEND PROCESSED SUBSTRATE TO POST-PROCESSING

END

F I G.  3 A
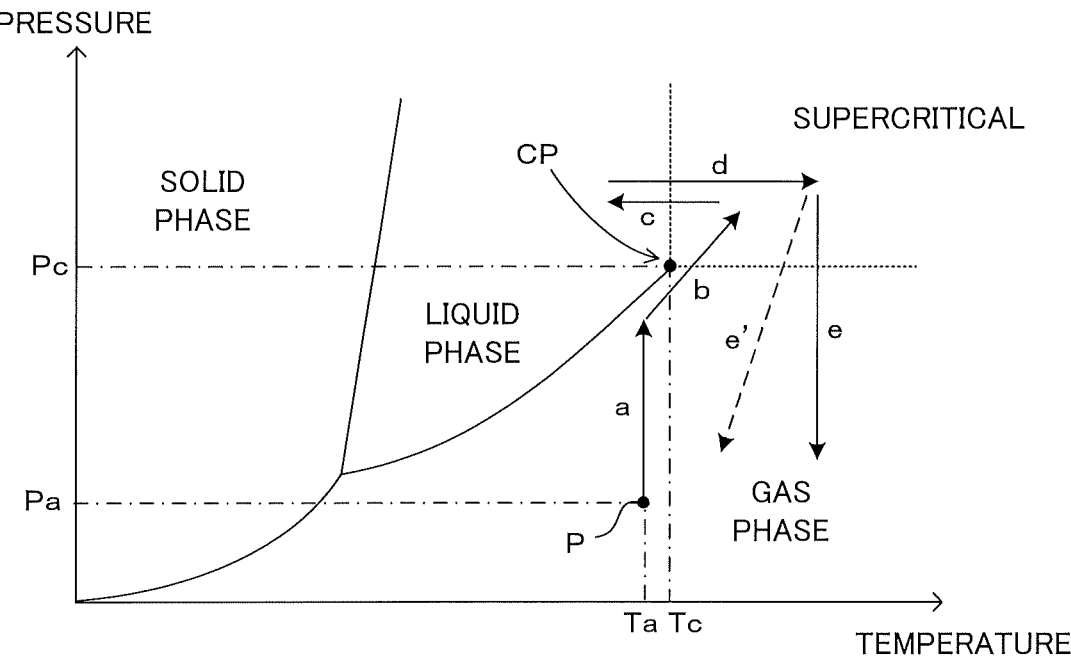
F I G.  3 B
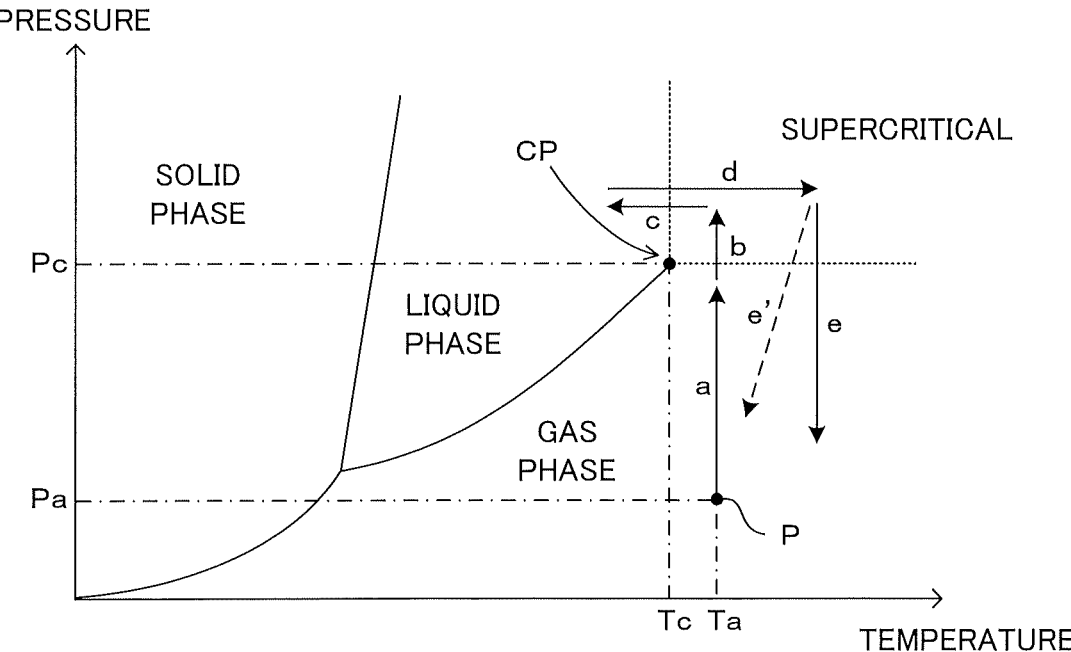

F I G. 5 A
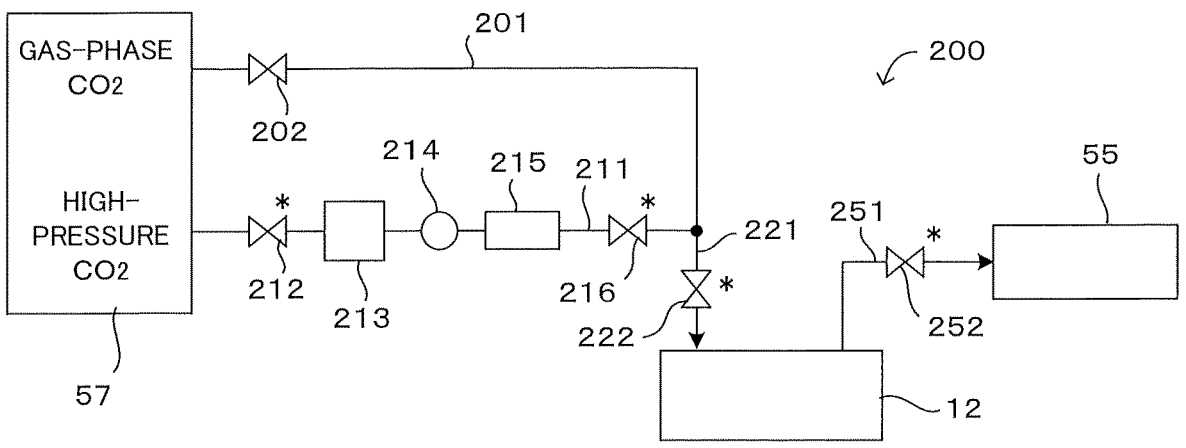
F I G. 5 B
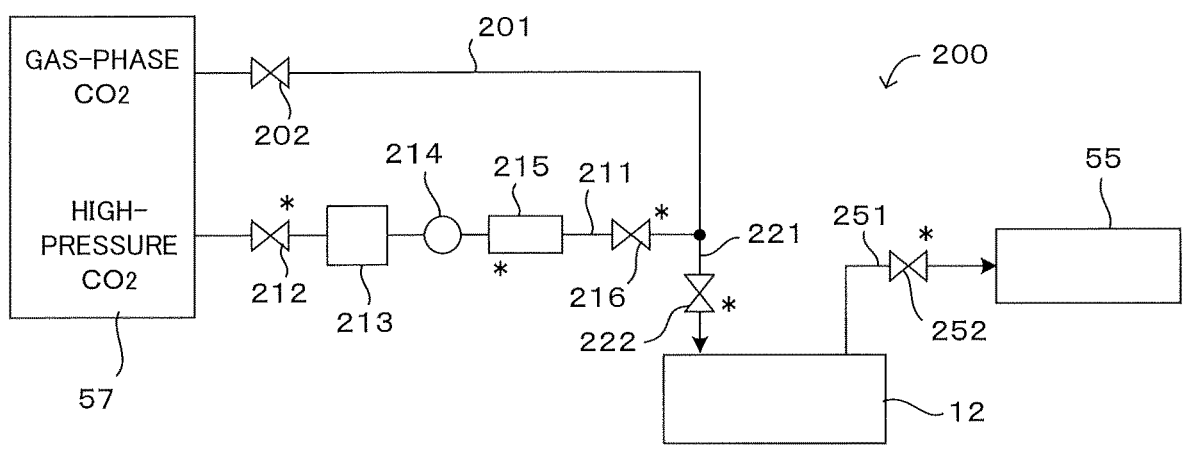
F I G. 5 C
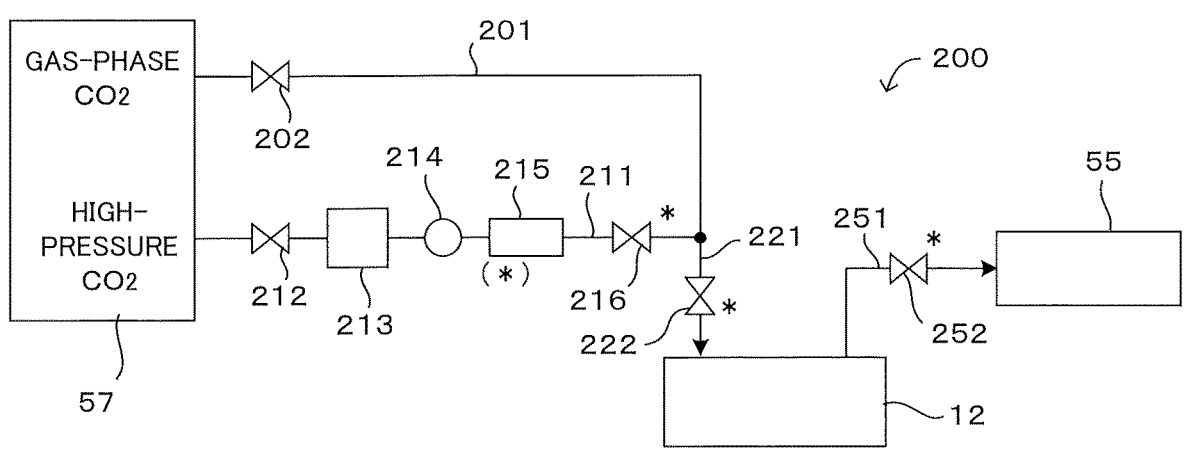

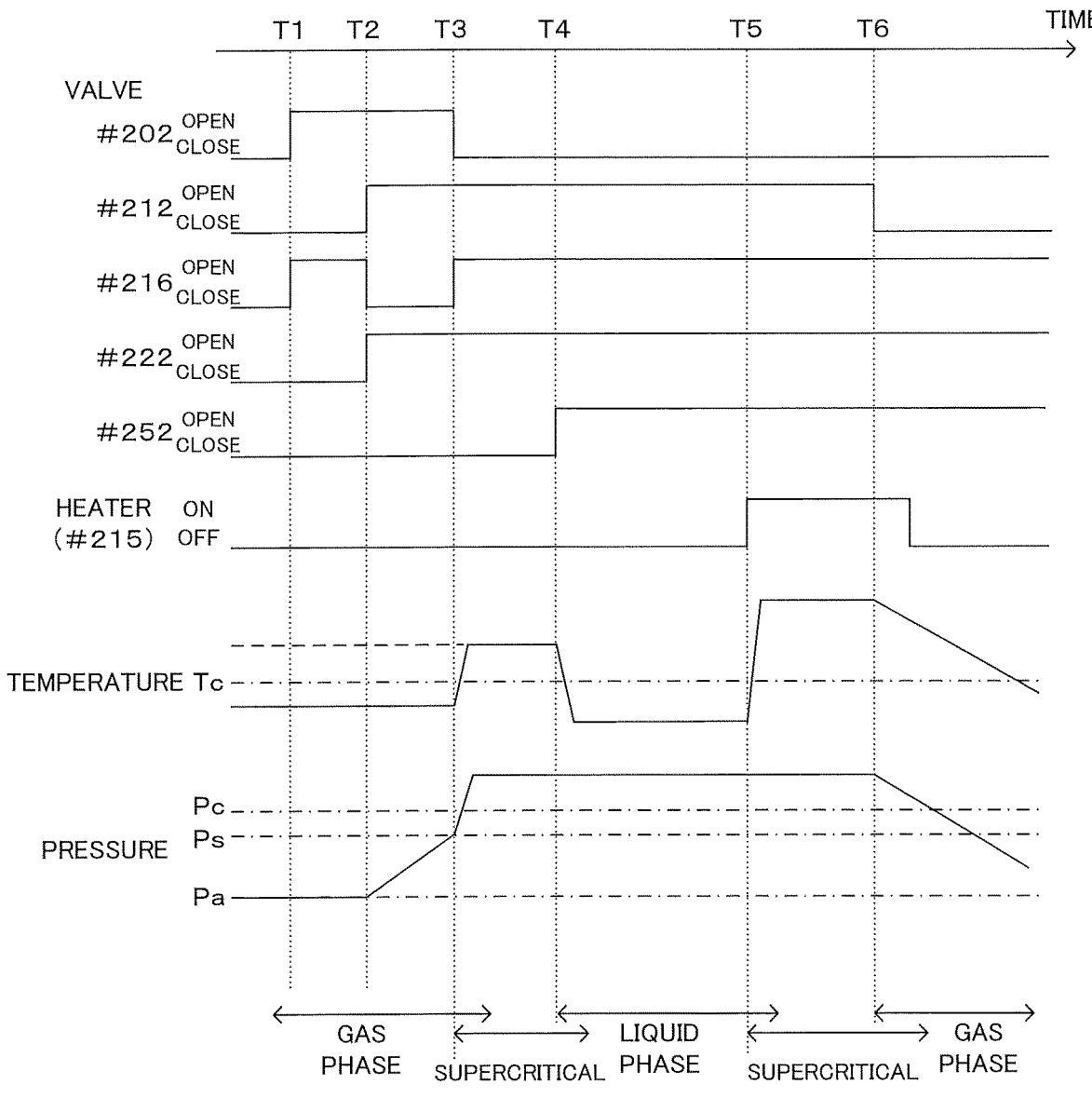
F I G. 6

F I G. 7
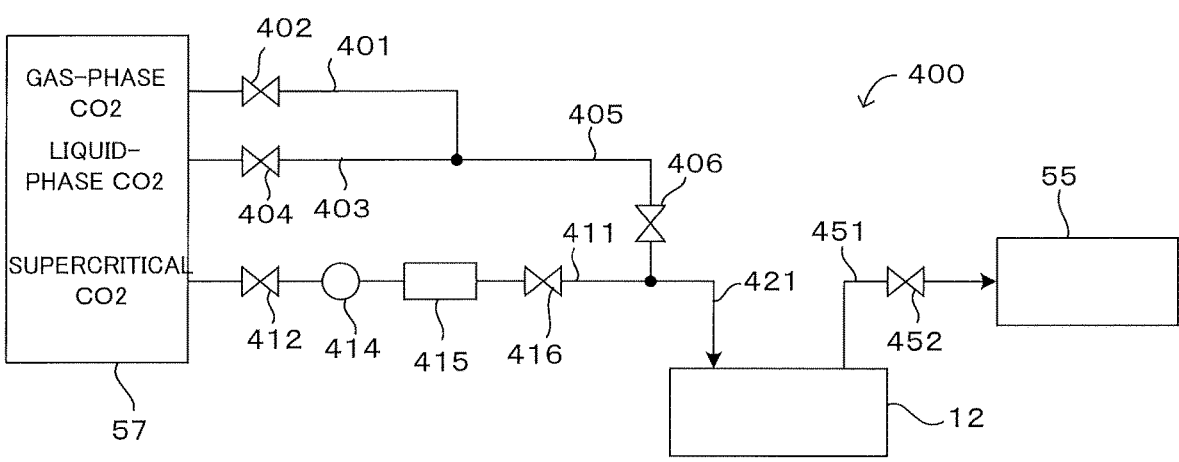

SUBSTRATE PROCESSING METHOD AND SUBSTRATE PROCESSING APPARATUS

CROSS-REFERENCE TO RELATED APPLICATIONS

The present application is a 35 U.S.C. §§ 371 national stage application of International Application No. PCT/JP2021/000812, filed Jan. 13, 2021, which claims priority to Japanese Patent Application No. 2020-059493, filed Mar. 30, 2020, the contents of which are incorporated herein by reference.

TECHNICAL FIELD

The present invention relates to a substrate processing technique of processing a substrate in a chamber using a processing fluid in a supercritical state, particularly to a technique of drying a substrate by replacing a liquid adhering to the substrate with a processing fluid.

BACKGROUND ART

Techniques of processing various types of substrate such as semiconductor substrates or glass substrates for display devices include a technique of processing a substrate using a processing fluid in a supercritical state. For example, a supercritical process may be used for the purpose of drying a substrate by removing a liquid adhering to the substrate. In this supercritical drying process, the liquid adhering to the substrate is replaced with a processing fluid having the property of dissolving the liquid well, and the processing fluid is changed from a supercritical state to a gas phase, thereby drying the substrate. The supercritical fluid has a property intermediate between liquid and gas, and has low viscosity, high fluidity, and extremely low surface tension. This brings about the following advantages, particularly in a substrate with a fine pattern formed on a surface. Specifically, a liquid remaining inside the pattern is removed effectively. Moreover, a problem of collapse of the pattern caused by surface tension is avoided.

According to a technique disclosed in PTL 1, for example, a processing chamber is filled with a liquid organic solvent and a substrate is immersed in the processing chamber, and carbon dioxide in a liquid form is thereafter supplied into the processing chamber, thereby replacing the solvent. Next, the carbon dioxide is changed from a liquid phase to a super-critical state and then vaporized, thereby drying the substrate. As another example, according to a technique disclosed in PTL 2, for example, carbon dioxide in a supercritical state is supplied into a chamber to replace a liquid adhering to the substrate, and the carbon dioxide in a supercritical state is vaporized, thereby drying the substrate.

CITATION LIST

Patent Literatures

[PTL 1] JP2018-531511A
[PTL 2] JP2018-060895A

SUMMARY OF INVENTION

Technical Problem

According to the technique disclosed in PTL 1, as the solvent filling the processing chamber is replaced with the liquid processing fluid (carbon dioxide), the processing fluid is consumed to an extremely large amount. The amount of the solvent may be reduced by placing the substrate in a state of being covered with a thin liquid film. However, this causes a risk of contamination of the substrate by impurity in the processing fluid appearing at an interface between a gas phase and a liquid phase (gas-liquid interface) formed between an atmosphere in the processing chamber and the processing fluid introduced in a liquid state.

According to the technique disclosed in PTL 2, as the supercritical fluid is supplied directly to the substrate covered with the liquid, no gas-liquid interface is generated. As a practical problem, however, as a fluid in a supercritical state is lower in density than a fluid in a liquid phase, it is poorer than a processing fluid in a liquid phase in terms of efficiency of replacement of a liquid component. To generate a supercritical processing fluid of high density, a higher pressure is required. This causes size increase of a facility and increase in consumed energy.

As described above, there is room for improvement in the above-described conventional techniques in terms of preventing contamination of a substrate caused by the occurrence of a gas-liquid interface and increasing efficiency of replacement of a liquid adhering to the substrate while restricting increase in devices and increase in processing cost.

Solution to Problem

The present invention has been made in view of the above-described problem. In connection with a substrate processing technique of processing a substrate using a processing fluid in a supercritical state, an object of the present invention is to provide a technique allowing a liquid adhering to a substrate to be replaced with good replacement efficiency with a processing fluid while preventing contamination of the substrate resulting from the occurrence of a gas-liquid interface.

One aspect of the present invention is intended for a substrate processing method of drying a substrate by replacing a liquid adhering to the substrate with a processing fluid in a supercritical state. To attain the above-described object, the method includes: a first step of introducing the processing fluid in a gas phase into a chamber housing the substrate; a second step of changing the processing fluid in the chamber from the gas phase to a supercritical state without intervention of a liquid phase; a third step of changing the processing fluid in the chamber from the supercritical state to a liquid phase; a fourth step of changing the processing fluid in the chamber from the liquid phase to a supercritical state; and a fifth step of changing the processing fluid in the chamber from the supercritical state to a gas phase without intervention of a liquid phase and discharging the processing fluid from the chamber.

According to the invention having the above-described configuration, the processing fluid in the chamber changes in phase in the order of a gas phase, supercritical, a liquid phase, supercritical, and a gas phase. Thus, in the chamber, a gas phase and a liquid phase of the processing fluid are not mixed with each other so a gas-liquid interface does not occur. This makes it possible to prevent adhesion of impurity to the substrate to be caused by a gas-liquid interface. Meanwhile, as the chamber can be filled with the processing fluid in a liquid phase, high replacement efficiency brought about by the high-density processing fluid can also be attained.

3

Advantageous Effects of Invention

As described above, according to the present invention, a chamber can be filled with a processing fluid in a liquid phase without mixing a processing fluid in a gas phase and a processing fluid in a liquid phase in the chamber. This makes it possible to achieve both prevention of contamination of a substrate to be caused by a gas-liquid interface and high replacement efficiency by filling a chamber with a high-density processing fluid in a liquid phase.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

BRIEF DESCRIPTION OF DRAWINGS

FIG. 1 is a drawing showing a substrate processing apparatus capable of implementing a substrate processing method according to the invention.

FIG. 2 is a flowchart showing the process performed by a substrate processing system.

FIG. 3A is a drawing showing change in the state of a processing fluid in the processing chamber according to the embodiment.

FIG. 3B is a drawing showing change in the state of a processing fluid in the processing chamber according to the embodiment.

FIG. 5A is a drawing showing an exemplary route of passage of a processing fluid and an operation state along the route.

FIG. 5B is a drawing showing an exemplary route of passage of a processing fluid and an operation state along the route.

FIG. 5C is a drawing showing an exemplary route of passage of a processing fluid and an operation state along the route.

FIG. 6 is a timing chart showing the operation of each element.

FIG. 7 is a diagram showing a different exemplary configuration of a piping system.

DESCRIPTION OF EMBODIMENTS

Figure 4A:
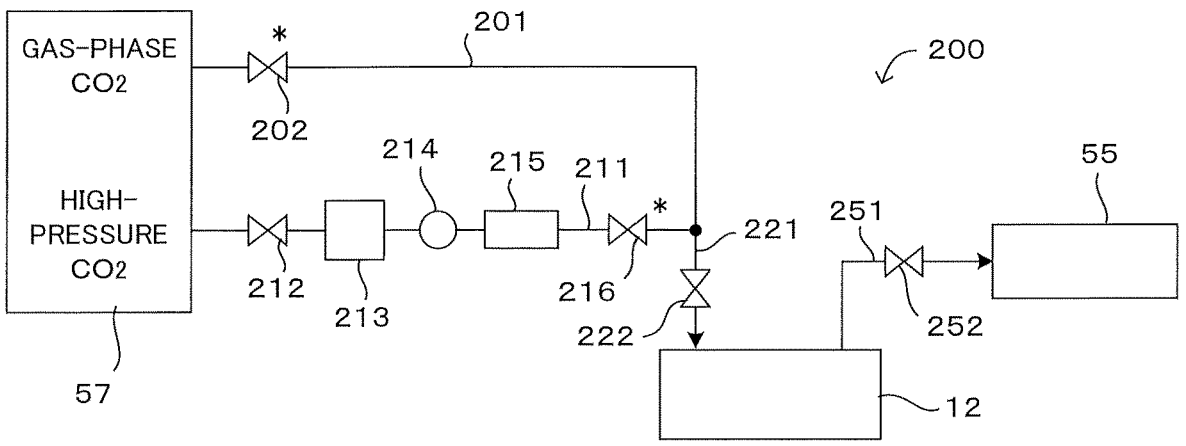
FIG. 4A is a drawing showing an exemplary route of passage of a processing fluid and an operation state along the route.

FIG. 1 is a drawing which shows a schematic configuration of a substrate processing apparatus capable of implementing a substrate processing method according to the present invention. This substrate processing apparatus 1 is an apparatus for processing surfaces of various substrates such as semiconductor substrates using supercritical fluids. To show directions in each figure in a unified manner below, an XYZ orthogonal coordinate system is set as shown in FIG. 1. Here, an XY plane represents a horizontal plane and a Z direction represents a vertical direction. More specifically, a (−Z) direction represents a vertically downward direction.

Various substrates such as semiconductor wafers, glass substrates for photomask, glass substrates for liquid crystal display, glass substrates for plasma display, substrates for FED (Field Emission Display), substrates for optical disk, substrates for magnetic disk, and substrates for magneto-optical disk can be adopted as the "substrate" in this embodiment. A substrate processing apparatus used to process a semiconductor wafer is mainly described as an example with reference to the drawings, but the substrate processing apparatus can be adopted also to process various substrates illustrated above. Also as a shape of the substrate, various types are applicable.

The substrate processing apparatus 1 includes a processing unit 10, a transfer unit 30, a supply unit 50 and a control unit 90. The processing unit 10 serves as an execution subject of a supercritical drying process. The transfer unit 30 receives an unprocessed substrate S transported by an external transport apparatus not shown in the figure and carries the substrate S into the processing unit 10. Further, the transfer unit 30 delivers a processed substrate S from the processing unit 10 to the external transport apparatus. The supply unit 50 supplies chemical substances and power necessary for the process to the processing unit 10 and the transfer unit 30.

The control unit 90 realizes a predetermined process by controlling these components of the apparatus. For this purpose, the control unit 90 includes a CPU 91, a memory 92, a storage 93, an interface 94, and the like. The CPU 91 executes various control programs. The memory 92 temporarily stores processing data. The storage 93 stores the control programs to be executed by the CPU 91. The interface 94 exchanges information with a user and an external apparatus. Operations of the apparatus to be described later are realized by the CPU 91 causing each component of the apparatus to perform a predetermined operation by executing the control program written in the storage 93 in advance.

The processing unit 10 has a structure in which a processing chamber 12 is settled on a pedestal 11. The processing chamber 12 is structured by a combination of several metal blocks which form a hollow inside serving as a processing space SP. A substrate S to be processed is carried into the processing space SP to be processed. A slit-like aperture 121 elongated in an X direction is formed in a (−Y) side surface of the processing chamber 12. The processing space SP communicates with an outside space via the aperture 121.

A lid part 13 is provided on the (−Y) side surface of the processing chamber 12 to close the aperture 121. By doing so, a processing to the substrate S under a high pressure in the internal processing space SP is allowed. A support tray 15 in the form of a flat plate is attached in a horizontal posture to a (+Y) side surface of the lid part 13. The upper surface of the support tray 15 serves as a support surface on which the substrate S can be placed. The lid part 13 is supported horizontally movably in a Y direction by an unillustrated support mechanism.

The lid part 13 is movable toward and away from the processing chamber 12 by an advancing mechanism 53 provided in the supply unit 50. Specifically, the advancing mechanism 53 includes a linear mechanism such as a linear motor, a linear guide, a ball-screw mechanism, a solenoid or an air cylinder. Such a linear mechanism moves the lid part 13 in the Y direction. The advancing mechanism 53 operates in response to a control command from the control unit 90.

By a movement of the lid part 13 in a (–Y) direction, the lid part 13 separates away from the processing chamber 12 and the support tray 15 is pulled out from the processing space SP to outside via the aperture 121. By doing so, the support tray 15 is accessible from outside. Specifically, it becomes possible to place the substrate S on the support tray 15 and take out the substrate S placed on the support tray 15. On the other hand, the lid part 13 moves in a (+Y) direction, whereby the support tray 15 is accommodated into the processing space SP. If the substrate S is placed on the support tray 15, the substrate S is carried into the processing space SP together with the support tray 15.

The lid part 13 moves in the (+Y) direction to close the aperture 121, whereby the processing space SP is sealed. A sealing member 122 is provided between the (+Y) side surface of the lid part 13 and the (–Y) side surface of the processing chamber 12 and an airtight state of the processing space SP is maintained. The seal member 12 is made of rubber material, for example. Further, the lid part 13 is fixed to the processing chamber 12 by an unillustrated lock mechanism. As described above, in this embodiment, the lid part 13 is switched between a closing state (solid line) to close the aperture 121 and seal the processing space SP and a separating state (dotted line) to enable the substrate S to pass through by separating widely from the aperture 121.

The substrate S is processed in the processing space SP with the airtight state of the processing space SP ensured in this way. In this embodiment, a fluid of a substance usable for a supercritical process, e.g. carbon dioxide, is sent from a fluid supplier 57 provided in the supply unit 50 as the processing fluid. The processing fluid is supplied to the processing unit 10 in a gaseous, liquid or supercritical state. Carbon dioxide enters a supercritical state at relatively low temperature and low pressure and is a chemical substance suitable for the supercritical drying process in having a property of dissolving an organic solvent often used in substrate processing well. At a critical point of carbon dioxide at which the fluid comes into the supercritical state, a pressure (critical pressure) is 7.38 MPa and a temperature (critical temperature) is 31.1° C.

The processing fluid is poured into the processing space SP. When the interior of the processing space SP reaches an appropriate temperature and an appropriate pressure, the processing space SP becomes filled with the processing fluid in a supercritical state. By doing so, the substrate S is processed using the supercritical fluid in the processing chamber 12. The supply unit 50 is provided with a fluid collector 55 and the fluid after the process is collected by the fluid collector 55. The fluid supplier 57 and the fluid collector 55 are controlled by the control unit 90.

To prevent the processing fluid in a supercritical state from being cooled to be changed in phase in the processing chamber 12, a suitable heat source is preferably provided in the processing chamber 12. In particular, in the present embodiment, to prevent the occurrence of unintentional phase change around the substrate S, a built-in heater (not shown in the drawings) is provided in the support tray 15. The heater is controlled in temperature by a temperature controller 59 of the supply unit 50. The temperature controller 59 operates in response to a control command from the control unit 90 and also has the function of controlling the temperature of a processing fluid supplied from the fluid supplier 57, as described later.

The processing space SP has a shape and a capacity in which the support tray 15 and the substrate S supported on the support tray 15 are receivable. Specifically, the processing space SP has a rectangular sectional shape greater in the horizontal direction than the width of the support tray 15 and greater in the vertical direction than a height covering the support tray 15 and the substrate S, and has a depth with which the support tray 15 is receivable. In this way, the processing space SP has a shape and a capacity sufficient for receiving the support tray 15 and the substrate S. Meanwhile, only a slight gap is formed from the support tray 15 and the substrate S to an inner wall surface of the processing space SP. Thus, the processing fluid necessary for filling the processing space SP can be controlled to a relatively small amount.

The transfer unit 30 is responsible for transfer of the substrate S between the external transport device and the support tray 15. For this purpose, the transfer unit 30 includes a body 31, an up/down member 33, a base member 35, and a plurality of lift pins 37. The up/down member 33 is a columnar member extending in the Z direction and is supported movably in the Z direction by a support mechanism not shown in the drawings. The base member 35 having a substantially horizontal upper surface is attached on the up-and-down member 33. The lift pins 37 are provided upward in standing positions from the upper surface of the base member 35. Each of the lift pins 37 has an upper end to abut on the lower surface of the substrate S, thereby supporting the substrate S from below in a horizontal posture. To support the substrate S stably in a horizontal posture, it is desirable to provide three or more lift pins 37 having upper ends of substantially equal heights.

The up/down member 33 can be moved up and down by an elevating mechanism 51 provided to the supply unit 50. More specifically, the elevating mechanism 51 includes a linear-motion mechanism such as a liner motor, a linear-motion guide, a ball screw mechanism, a solenoid, or an air cylinder, for example, and such a linear-motion mechanism moves the up/down member 33 in the Z direction. The elevating mechanism 51 operates in response to a control command from the control unit 90.

The up/down movement of the up/down member 33 moves the base member 35 up and down, and moves the lift pins 37 integrally with the base member 35. By doing so, the substrate S is transferred between the transfer unit 30 and the support tray 15. More specifically, the substrate S is transferred while the support tray 15 is pulled out to the outside of the chamber as indicated by dotted lines in FIG. 1. For this purpose, the support tray 15 is provided with a through hole 152 for passage of the lift pin 37. When the base member 35 moves up, the upper end of the lift pin 37 is passed through the through hole 152 to reach a position above a support surface 151 of the support tray 15. In this state, the substrate S being transported by the external transport device is transferred to the lift pin 37. As the lift pin 37 moves down, the substrate S is transferred from the lift pin 37 to the support tray 15. The substrate S can be ejected through a procedure reverse to that described above.

FIG. 2 is a flowchart showing part of the process performed by a substrate processing system including the above-described substrate processing apparatus. The substrate processing apparatus 1 performs a supercritical drying process, specifically, a process of drying the substrate S after being cleaned with a cleaning liquid in a previous step. This process is described in detail next. The substrate S as a processing target is cleaned with a cleaning liquid in a previous step performed by a different substrate processing apparatus forming the substrate processing system (step S101). Then, while the substrate S is given a liquid film made of isopropyl alcohol (IPA), for example, formed on its surface (step S102), the substrate S is transported to the substrate processing apparatus 1. The substrate S is housed in the processing chamber 12 (step S103).

For example, a fine pattern formed on a surface of the substrate S causes a risk of collapse of the pattern due to the surface tension of a remaining liquid adhering to the substrate S. In another case, a watermark may remain on the surface of the substrate S due to insufficient drying. In another case, alteration such as oxidation may be caused if the surface of the substrate S contacts outside air. To prevent these problems before they occur, the substrate S may be transported while the surface (pattern forming surface) of the substrate S is covered with a liquid or solid surface layer.

If the cleaning liquid is mainly composed of water, for example, the substrate W is transported while the substrate S is given a liquid film formed using a liquid lower in surface tension and less corrosive to a substrate than water that may be an organic solvent such as IPA or acetone, for example. Specifically, the substrate S is transported to the substrate processing apparatus 1 while being supported in a horizontal state and given the liquid film formed on its upper surface.

The substrate S is placed on the support tray 15 while the pattern forming surface is positioned as an upper surface and the upper surface is covered with the thin liquid film. When the support tray 15 and the lid member 13 move integrally in a (+Y) direction, the support tray 15 supporting the substrate S is housed in the processing space SP in the processing chamber 12 and the opening 121 is closed by the lid member 13.

In this state, carbon dioxide as a processing fluid is introduced in a gas phase into the processing space SP (step S104). While outside air enters the processing space SP during incoming transport of the substrate S, the air can be replaced by introducing the processing fluid in a gas phase. Injecting the processing fluid in a gas phase further increases a pressure in the processing chamber 12.

When the pressure is increased sufficiently, a processing fluid in a supercritical state is introduced (step S105). The processing fluid in a supercritical state may be supplied from outside. In another configuration, phase change may be generated in the processing space SP to make transition of the processing fluid from a gas phase to a supercritical state. A processing fluid in a liquid phase is introduced subsequently while the processing space SP is filled with the supercritical fluid (step S106). Introducing the liquid after the processing fluid in the processing space SP is changed from a gas phase to a supercritical state avoids formation of a gas-liquid interface occurring when a liquid phase and a gas phase are mixed with each other. Also, filling the processing space SP with the processing fluid in a liquid phase higher in density than the supercritical fluid allows the remaining liquid component (IPA) adhering to the substrate S to be replaced efficiently.

Next, the processing fluid in the processing space SP is discharged to dry the substrate S. More specifically, a processing fluid in a supercritical state is introduced into the processing space SP filled with the processing fluid in a liquid phase (step S107). The processing fluid in a supercritical state may be introduced from outside. In another configuration, the processing fluid in a liquid phase having a higher pressure than a critical pressure may be heated to make transition to a supercritical state. By reducing a pressure in the processing space SP from a state of being filled with the supercritical fluid, the processing fluid is discharged to the outside while being vaporized (step S108). At this time, a speed of the pressure reduction is adjusted so as not to generate a solid phase and a liquid phase by sudden temperature reduction. By doing so, the processing fluid in the processing space SP is vaporized directly from a supercritical state and discharged to the outside. In this way, formation of a gas-liquid interface is also avoided during discharge of the processing fluid.

As described above, in the supercritical drying process of the present embodiment, the processing space SP is filled with the processing fluid in a liquid phase. By doing so, a liquid adhering to the substrate S is replaced efficiently, making it possible to prevent the liquid from remaining on the substrate S. Furthermore, a substrate can be dried while problems such as contamination of the substrate due to attachment of impurity, pattern collapse, etc. resulting from formation of a gas-liquid interface are avoided.

The processed substrate S is sent to a subsequent step (step S109). Specifically, the lid member 13 moves in a (−Y) direction to pull out the support tray 15 from the processing chamber 12 to the outside. The substrate S is transferred to the external transport device via the transfer unit 30. At this time, the substrate S is in a dried state. The substance of the subsequent step is determined freely.

FIGS. 3A and 3B are drawings which show change in the state of a processing fluid in the processing chamber according to the present embodiment. The state diagrams correspond to a case of using carbon dioxide as the processing fluid. As described previously, a critical temperature Tc and a critical pressure Pc corresponding to a critical point CP are about 31.1° C., and about 7.38 MPa respectively. In the drawings, a reference sign Pa shows an atmospheric pressure.

The change in the state of a processing fluid occurring in the series of supercritical drying processes described above can include at least two cases shown in FIGS. 3A and 3B. In the cases shown in FIGS. 3A and 3B, the processing fluid starts from a state indicated by a point P, and exhibits state change schematically indicated by arrows with signs a to e. In comparison to the flowchart of FIG. 2, the arrow a corresponds to step S104, the arrow b to step S105, the arrow c to step S106, the arrow d to step S107, and the arrow e to step S108, respectively.

In the case shown in FIG. 3A, as indicated by the point P, a processing fluid in a gas phase is supplied at a temperature slightly lower than the critical temperature Tc to the processing space SP. The temperature of the processing fluid at this time is called an "initial temperature" and given a sign Ta. The processing fluid in a gas phase is fed under pressure from the fluid supplier 57 to increase the pressure of the processing fluid gradually also in the processing space SP, as indicated by the arrow a. As indicated by the arrow b, shortly before the processing fluid reaches a transition point at which the processing fluid makes phase transition from a gas phase to a liquid phase at an initial temperature Ta, the processing fluid is subjected to adiabatic compression to make transition to a supercritical state. For example, transition of the gas in the processing space SP to a supercritical state can be made by introducing a processing fluid of a pressure higher than the critical pressure Pc.

The adiabatic compression increases both a pressure and a temperature to make transition of the processing fluid to a supercritical state without passing through a liquid phase. In other words, the temperature of the processing fluid in a gas phase (initial temperature Ta) and timing of introduction of the high-pressure processing fluid are set in order to prevent the occurrence of phase change to a liquid phase. At this time, the temperature of the processing fluid can be a temperature slightly lower than the critical temperature Tc and may be about 25° C., for example.

During the state change of the arrow a, in the processing chamber 12, a temperature is from 10 to 30° C., for example. A pressure therein is slightly higher than the vapor pressure of the processing fluid corresponding to the temperature in the chamber. During the state change of the arrow b, a temperature and a pressure in the processing chamber 12 are from 35 to 45° C. and from 10 to 12 MPa respectively, for example.

Next, as indicated by the arrow c, the processing fluid makes transition from a supercritical state to a liquid phase. For example, a processing fluid in a liquid phase is supplied from the fluid supplier 57 to the processing space SP. By doing so, the temperature of the processing fluid in the processing space SP is reduced to allow the processing space SP to be filled with the processing fluid in a liquid phase. The arrow c shows that only a temperature is reduced while a pressure is unchanged. However, a pressure may change in a range not falling under the critical pressure Pc.

At first, the processing fluid is supplied at the initial temperature Ta lower than the critical temperature Tc. Then, the temperature of the processing fluid itself is increased by adiabatic compression to make the temperature of the processing fluid exceed the critical temperature Tc. Thus, a temperature in the processing chamber 12 and that in a pipe connected to the processing chamber 12 are considered to be lower than the temperature of the processing fluid brought into a supercritical state. This allows the processing fluid to be cooled to a temperature lower than the critical temperature Tc and to be shifted to a liquid phase in a short period of time.

By maintaining the state of filling the processing space SP with the processing fluid in a liquid phase for a certain period of time, a liquid component adhering to the substrate S can be replaced sufficiently and can be removed from the substrate S. Then, as indicated by the arrow d, the temperature of the processing fluid is increased to make transition of the processing fluid to a supercritical state again. The arrow d shows that only a temperature is increased while a pressure is unchanged. In this case, however, a pressure may also change in a range not falling under the critical pressure Pc.

After the processing space SP is filled with the processing fluid in a supercritical state, a pressure in the processing space SP is reduced as shown by the arrow e. By doing so, the pressure of the processing fluid is reduced to make transition from a supercritical state to a gas phase. The arrow e shows that no temperature change occurs. As shown by a dashed arrow e', however, temperature reduction may occur within a range not passing through a liquid phase range and a solid phase range.

During the state change of the arrow c, a temperature and a pressure in the processing chamber 12 are from 10 to 30° C. and from 10 to 12 MPa respectively, for example. During the state change of the arrow d, a temperature and a pressure in the processing chamber 12 are from 40 to 70° C. and from 10 to 12 MPa respectively, for example. During the state change of the arrow e, in the processing chamber 12, a temperature is from 40 to 70° C. and a pressure is reduced from 10 to 12 MPa to an atmospheric pressure, for example.

On the other hand, in the case shown in FIG. 3B, as indicated by the point P, the initial temperature Ta of a processing fluid in a gas phase is slightly higher than the critical temperature Tc. In this case, as indicated by the arrow b, temperature increase through adiabatic compression is not indispensable for making transition to a supercritical state. However, as it is impossible to supply a processing fluid at a pressure of equal to or greater than the critical pressure Pc while maintaining the processing fluid in a gas phase, supply of a high-pressure processing fluid is also required like in the above-described case. In making the transition from a supercritical state to a liquid phase indicated by the arrow c, if a temperature in the processing chamber 12 and that in the pipe exceed the critical temperature Tc, it may take longer time for the processing fluid in the processing space SP to be liquefied entirely than in the above-described case. Subsequent state change occurs in the same way as in the case shown in FIG. 3A.

In the case shown in FIG. 3B, during the state change of the arrow a, in the processing chamber 12, a temperature is from 35 to 45° C., for example, and a pressure is lower than a critical pressure at each of these temperatures. During the state change of the arrow b, a temperature and a pressure in the processing chamber 12 are from 35 to 50° C. and from 10 to 12 MPa respectively, for example. During the state change of the arrow c, a temperature and a pressure in the processing chamber 12 are from 10 to 30° C. and from 10 to 12 MPa respectively, for example. During the state change of the arrow d, a temperature and a pressure in the processing chamber 12 are from 40 to 70° C. and from 10 to 12 MPa respectively, for example. During the state change of the arrow e, in the processing chamber 12, a temperature is from 40 to 70° C. and a pressure is reduced from 10 to 12 MPa to an atmospheric pressure, for example.

In particular, in the process involving phase change including the supercritical state of a processing fluid, making state transition in the vicinity of the critical point CP as in the above-described manner makes it possible to shorten time required for the transition, thereby limiting consumptions of energy and a processing fluid.

Next, a more specific system configuration for performing the above-described processes and its operation flow will be described by referring to FIGS. 4A to 6. FIGS. 4A to 4C and FIGS. 5A to 5C are drawings each showing an exemplary route of passage of a processing fluid and an operation state along the route. FIG. 6 is a timing chart showing the operation of each element. Pipes as flow passages for a processing fluid, on/off valves, etc. are provided between the fluid supplier 57 and the processing chamber 12 and between the processing chamber 12 and the fluid collector 55, while these elements have not been mentioned above as the description given so far is intended for the principles. In the following, this piping system as a whole will be given a reference sign 200.

As shown in FIG. 4A, in this example, the fluid supplier 57 has the function of outputting carbon dioxide ($CO_2$) as a processing fluid in a gas phase and the function of outputting carbon dioxide at a higher pressure than the critical pressure Pc. As described above, the processing fluid to be output in a gas phase (this is illustrated as "gas-phase $CO_2$" in the drawings) cannot be at a pressure of equal to or higher than the critical pressure Pc. The processing fluid may be output at a pressure of 5 MPa, for example, which is the highest possible pressure within a feasible range. In the following, this pressure will be called a "feeding pressure" and will be given a sign Ps. A pipe 201 is connected to output of gaseous $CO_2$ and a valve 202 is interposed in the pipe 201.

On the other hand, a processing fluid to be output at a higher pressure (12 MPa, for example) than the critical pressure Pc (this is illustrated as "high-pressure $CO_2$" in the drawings) can take either a liquid phase or a supercritical state depending on the temperature of the processing fluid. The fluid supplier 57 itself may adjust the temperature of the processing fluid and may switch between a liquid phase and a supercritical state. In this regard, the piping system 200 includes a heater for heating a high-pressure processing fluid, as described later. Thus, the fluid supplier 57 may be configured to output only a processing fluid of a lower temperature than the critical temperature Tc, namely, in a liquid phase.

Output of the high-pressure $CO_2$ is connected to a pipe 211. The pipe 211 is provided with a valve 212, a buffer unit 213, a temperature sensor 214, a heater 215, and a valve 216 interposed in this order as viewed from an upstream side. The buffer unit 213 includes storage space having a larger sectional area than the pipe 211 upstream from the buffer unit 213 in a direction of fluid passage. This allows a processing fluid output from the fluid supplier 57 to be stored temporarily in the buffer unit 213. The buffer unit 213 has two functions as follows. A first function is to achieve a supercritical state by adiabatically compressing the processing fluid temporarily stored in the buffer unit 213. A second function is to prevent change of the processing fluid from a supercritical state to a liquid phase to be caused by temperature reduction due to expansion of the processing fluid when the processing fluid is released from the pipe into the processing space SP.

The pipes 201 and 211 merge on the output sides of the valves 202 and 216 respectively into a pipe 221. A valve 222 is interposed in the pipe 221. The pipe 221 is connected to the processing chamber 12 on the output side of the valve 222. The processing chamber 12 and the fluid collector 55 are connected to each other through a pipe 251, and a valve 252 is interposed in the pipe 251.

The above-described valves operate in response to control commands from the control unit 90 to open and close the pipes and make flow rate adjustment. The heater 215 is controlled by the temperature controller 59 of the supply unit 50, and heats a passed fluid to adjust the fluid at an intended temperature. For this purpose, the pipe 211 is provided with the temperature sensor 214 for detecting the temperature of a processing fluid. Specifically, output of the temperature sensor 214 is given to the temperature controller 59, and the temperature controller 59 controls electrical conduction of the heater 215 on the basis of the given output.

The following describes the supercritical drying process performed by the substrate processing apparatus 1 with the piping system 200 having the above-described configuration. In each of FIGS. 4A to 5C, some of the valves to which "*" are given to the vicinities show that these valves are in an open state, and the other valves are in a closed state. Likewise, as the heater 215, "*" shows that a processing fluid is being heated, and the heater 215 without "*" shows that the processing fluid is not being heated.

In FIG. 6, a reference sign "#202" means the valve 202 shown in FIG. 4A. Likewise, reference signs "#212," "#216", "#222," and "#252" mean the valves 212, 216, 222, and 252 respectively.

A state shown in FIG. 4A corresponds to an initial state before start of the supercritical drying process. A period between time T1 and time T2 in FIG. 6 corresponds to this state. Valves opened in the initial state include the valve 202 in the pipe 201 connected to the gas-phase $CO_2$ output of the fluid supplier 57 and the valve 216 provided on the output side of the heater 215 in the pipe 211 connected to the high-pressure $CO_2$ output and. The other valves are closed. This generates a state filled with the gas-phase $CO_2$ output from the fluid supplier 57 and at a lower pressure (5 MPa, for example) than the critical pressure Pc in the pipe 201, in a part of the pipe 211 downstream from the valve 212, and in a part of the pipe 221 upstream from the valve 222. The heater 215 stops heating of a fluid.

Figure 4B:
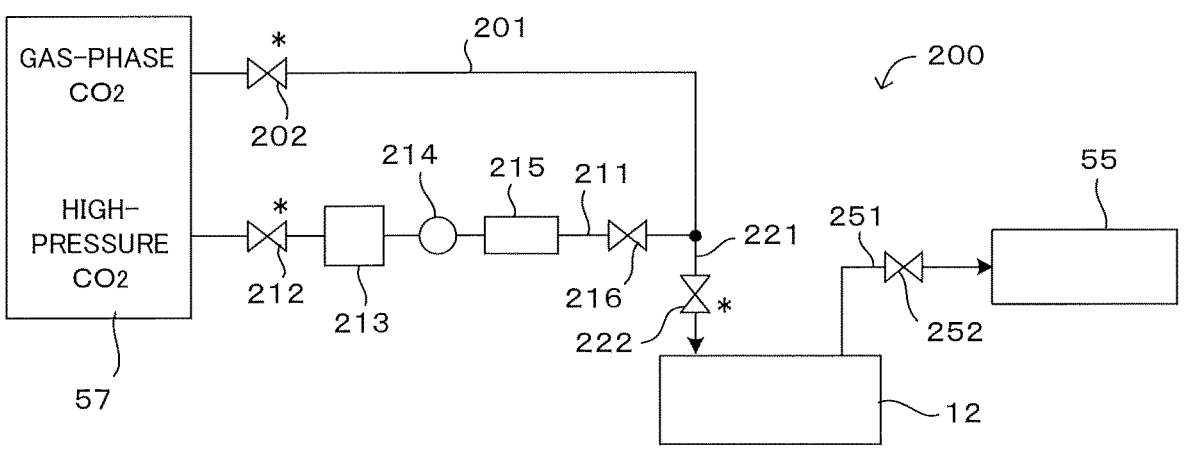
FIG. 4B is a drawing showing an exemplary route of passage of a processing fluid and an operation state along the route.
Figure 4C:
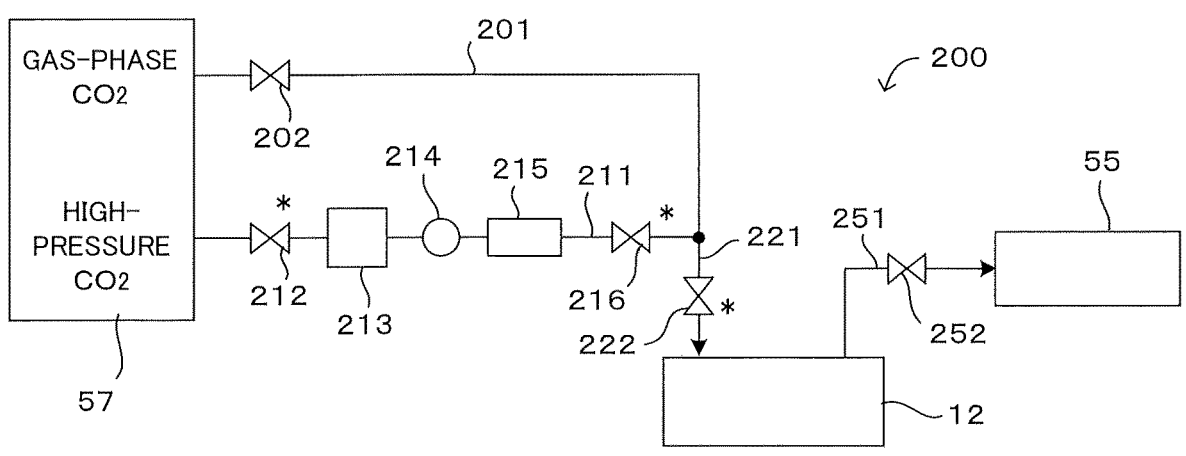
FIG. 4C is a drawing showing an exemplary route of passage of a processing fluid and an operation state along the route.

At the time T2, the valves 212 and 222 are newly opened and the valve 216 is closed. This corresponds to step S104 in FIG. 2 and the arrow a in FIG. 3A. FIG. 4B shows this state. Opening the valve 222 supplies the gas-phase $CO_2$ into the processing chamber 12. Thus, a pressure in the processing chamber 12 is increased gradually from the atmospheric pressure Pa.

On the other hand, in the pipe 211 through which the high-pressure $CO_2$ is passed, the output-side valve 216 is closed and the input-side valve 212 is opened. By doing so, a high-pressure processing fluid output from the fluid supplier 57 flows at a stroke into the pipe 211. Thus, the gas-phase processing fluid in the pipe 211 is adiabatically compressed. As a result, even without heating by the heater 215, the processing fluid is brought into a supercritical state of a high pressure and a high temperature (for example, 12 MPa and about 35° C.). Specifically, the pipe 211 is filled with the processing fluid in a supercritical state.

At time T3, the valve 202 is closed and the valve 216 is opened instead. This state corresponds to step S105 in FIG. 2, to the arrow b in FIG. 3A, and to FIG. 4C. By doing so, instead of the gas-phase processing fluid, the processing fluid in a supercritical state in the pipe 211 is supplied into the processing chamber 12. At this time, the heater 215 is not actuated.

As long as the gas-phase processing fluid is supplied to the processing chamber 12, a pressure in the processing chamber 12 is not increased to exceed the feeding pressure Ps of this processing fluid. On the other hand, as the high-pressure processing fluid flows from the pipe 211 at the time T3, gas in the processing chamber 12 is adiabatically compressed to be brought into a supercritical state. Namely, a temperature and a pressure in the processing chamber 12 exceed the critical temperature Tc and the critical pressure Pc respectively.

The temperature change before and after the time T3 indicated by a solid line in FIG. 6 shows the state change in FIG. 3A. If a state changes in the manner shown in FIG. 3B, a temperature in the processing chamber 12 exceeds the critical temperature Tc from the first as indicated by a dashed line in FIG. 6.

This state continues until the processing chamber 12 becomes filled with the supercritical fluid. Then, at time T4, the valve is 252 is opened. By doing so, the processing fluid in the processing chamber 12 is started to be discharged. Step S106 in FIG. 2, the arrow c in FIG. 3A, and FIG. 5A correspond to this state. At this time, while supply of the high-pressure $CO_2$ through the pipe 211 continues, the adiabatic compression does not occur. Thus, the high-pressure $CO_2$ is introduced in a liquid phase into the processing chamber 12.

A temperature in the processing chamber 12 falls below the critical temperature Tc. However, as the processing fluid is output at a pressure exceeding the critical pressure Pc from the fluid supplier 57, a pressure in the processing chamber 12 exceeds the critical pressure Pc. In terms of the purpose of filling the processing chamber 12 with a processing fluid in a liquid phase, a pressure in the processing chamber 12 may be equal to or less than the critical pressure.

A processing fluid in a liquid phase is supplied into the processing chamber 12, and at the same time, discharged from the processing chamber 12. By doing so, a liquid remaining on the substrate S (IPA) is replaced effectively. Specifically, the liquid adhering to the substrate S dissolves in the liquid processing fluid and is discharged together with the processing fluid. This state is continued for a certain period of time to discharge the liquid on the substrate S to the outside of the processing chamber 12.

At time T5, the heater 215 starts heating. This heats the high-pressure CO2 flowing in the pipe 211 to a temperature (for example, about 50° C.) higher than the critical temperature Tc and is supplied in a supercritical state into the processing chamber 12. Step S107 in FIG. 2, the arrow d in FIG. 3A, and FIG. 5B correspond to this state. The processing fluid in a liquid phase remaining in the processing chamber 12 is discharged to the outside or makes transition to a supercritical state by being heated. Finally, the processing chamber 12 is filled with the supercritical fluid.

Then, at time T6, the valve 212 is closed to stop supply of the high-pressure CO2. On the other hand, the valve 252 used for discharging a fluid from the processing chamber 12 is in an open state continuously to reduce a pressure in the processing chamber 12. Step S108 in FIG. 2, the arrow e (or arrow e') in FIG. 3A, and FIG. 5C correspond to this state. By doing so, the supercritical fluid in the processing chamber 12 is vaporized without intervention of a liquid phase and discharged. Finally, a pressure in the processing chamber 12 is reduced to a level near an atmospheric pressure to allow the dried substrate S to be ejected.

Regarding a temperature in the processing chamber 12, the heating state may be maintained as indicated by a solid line in terms of finishing drying of the substrate S. Further, as indicated by a dashed line, a temperature may be reduced gradually within a range in which change to a liquid phase or to a solid phase does not occur. When the substrate S is ejected from the processing chamber 12, the temperature of the substrate S is preferably reduced to almost room temperature.

As shown in FIG. 5C, the valve 216 provided in the pipe 211 for high-pressure $CO_2$ is also placed in an open state. By doing so, the high-pressure processing fluid remaining in the pipe 211 can also be discharged through the processing chamber 12. Regarding the heater 215, keeping the heater 215 continuously in an operating state for some time after the time T6 makes it possible to reduce the occurrence of sudden temperature reduction in the processing chamber 12. Heating by the heater 125 is stopped at appropriate time. By doing so, the temperature of the processing fluid in the pipe 211 can be reduced to prepare for a process on a next substrate. Stopping heating with the high-pressure processing fluid remaining in the pipe 211 is expected to achieve cooling effect using the processing fluid to be released.

As shown by the lower section of FIG. 6, during the series of the processes described above, the processing chamber 12 is initially filled with the gas-phase processing fluid. Introducing the supercritical fluid at the time T3 generates a state where a gas phase and a supercritical state are temporarily mixed with each other. Finally, the processing chamber 12 is filled with only the supercritical fluid. When the processing fluid in a liquid phase is introduced at the time T4, a liquid phase and a supercritical state are temporarily mixed with each other. Finally, only the liquid phase is present. When the supercritical fluid is introduced again at the time T5, a liquid phase and a supercritical state are temporarily mixed with each other. Finally, only the supercritical fluid is present. When pressure reduction is started in the processing chamber 12 at the time T6, a supercritical state and a gas phase are mixed with each other temporarily and then only the gas phase is present.

As described above, in the present embodiment, the processing fluid in the processing chamber 12 is initially in a gas phase, then makes transition to a liquid phase, and finally returns to a gas phase. At the stage of making transition from a gas phase to a liquid phase and the stage of making transition from a liquid phase to a gas phase, a supercritical state is always interposed between the phases. This means that direct phase change does not occur from a gas phase to a liquid phase and direct phase change does not occur from a liquid phase to a gas phase.

This allows the substrate S to be dried favorably while avoiding various problems such as contamination of the substrate due to attachment of impurity, collapse of a pattern formed on a surface, etc. resulting from exposure of the substrate S to a gas-liquid interface. Furthermore, compared to a process performed without intervention of a liquid phase, namely, a process involving transition only between a gas phase and a supercritical state, a higher-density processing fluid can be caused to contact the substrate. This allows a liquid adhering to the substrate to be replaced efficiently. This contributes to fulfillment of the effect of reducing the amount of use of a processing fluid or shortening processing time, for example.

As a means to reduce further the amount of use of a processing fluid, a following modification is also considered. In the above-described process, in a period from the time T5 to the time T6, namely, in making transition from a liquid phase to a supercritical state in the processing chamber 12, the valve 252 on the discharge side is opened. However, if the liquid having adhered to the substrate S is removed completely at the time T5, only the processing fluid in a liquid phase is present in the processing chamber 12. As long as transition can be made to a supercritical state without discharging this processing fluid, supply of an additional processing fluid is not indispensable. Specifically, the valve 252 may be closed at the time T5.

For example, the processing fluid in a liquid phase in the processing chamber 12 may be heated to make transition of this processing fluid to a supercritical state. For this purpose, the processing chamber 12 may be provided with a heater for heating a processing fluid inside the processing chamber 12. Alternatively, the heater provided to the support tray 15 can be used for this purpose.

FIG. 7 is a diagram which shows a different exemplary configuration of a piping system. If the fluid supplier 57 is capable of outputting a processing fluid in a gas phase, a processing fluid in a liquid phase, and a processing fluid in a supercritical state individually, the piping system can be configured as follows. In a piping system 400 of this example, a pipe 401 is connected to output of gas-phase $CO_2$ and a valve 402 is interposed in the pipe 401. A pipe 403 is connected to output of a processing fluid in a liquid phase (this is illustrated as "liquid-phase $CO_2$" in the drawing) and a valve 404 is interposed in the pipe 403. The pipes 401 and 403 merge on the output sides of the valves 402 and 404 respectively into a pipe 405. A valve 406 is interposed in the pipe 405.

Meanwhile, output of a processing fluid in a supercritical state (this is illustrated as "supercritical $CO_2$" in the drawing) is connected to a pipe 411. The pipe 411 is provided with a valve 412, a temperature sensor 414, a heater 415, and a valve 416 interposed in this order as viewed from an upstream side. The functions of these parts are the same as those of the corresponding parts in the above-described embodiment. A structure corresponding to the buffer unit 213 is omitted.

The pipes 405 and 411 merge on the output sides of the valves 406 and 416 respectively into a pipe 421. The pipe 421 is connected to the processing chamber 12. Like in the above-described embodiment, the processing chamber 12 and the fluid collector 55 are connected to each other through a pipe 451, and a valve 452 is interposed in the pipe 451.

In this configuration, a processing fluid in a gas phase is supplied through the pipe 401 in step S104, a processing fluid in a supercritical state is supplied through the pipe 411 in steps S105 and S107, and a processing fluid in a liquid phase is supplied through the pipe 403 in step S106, all from the fluid supplier 57 into the processing chamber 12. By doing so, a process comparable to that described above can be realized. In this case, as making transition from a liquid phase to a supercritical state through adiabatic compression is not required, a buffer unit is omissible from the piping system 400.

As described above, in the substrate processing apparatus 1 of the embodiment, the processing chamber 12 functions as a "chamber" of the present invention. Also, steps S104, S105, S106, S107, and S108 of the supercritical drying process shown in FIG. 2 correspond to a "first step," a "second step," a "third step," a "fourth step," and a "fifth step" of the present invention respectively.

Note that the invention is not limited to the above embodiment and various changes other than the aforementioned ones can be made without departing from the gist of the invention. For example, in the above-described embodiment, carbon dioxide is used as a processing fluid for the supercritical process and IPA is used as a liquid for forming a liquid film. However, these are shown merely as examples and chemical substances to be used are not limited to these.

While numerical values of temperatures and pressures in each step of the supercritical drying process have been shown above, these numerical values are given merely as examples. Specifically, as long as these numerical values maintain there relationships in terms of being greater or less than the values of a critical point, they can be modified, if appropriate.

As another example, in the above-described embodiment, transition of a processing fluid in the processing chamber 12 is made from a supercritical state to a liquid phase to fill the processing chamber 12 with the processing fluid in a liquid phase. This allows a liquid adhering to the substrate S to be replaced with the processing fluid with maximum performance. However, as long as contact of the surface of the substrate S as a whole with the processing fluid in a liquid phase is ensured, a state of mixture between a liquid phase and a supercritical state may be generated, for example.

As described above by giving the specific embodiment as an example, in the substrate processing method according to the present invention, the processing fluid lower in temperature than a critical temperature of the processing fluid may be brought into a supercritical state by being adiabatically compressed in the second step, for example. In this configuration, the temperature of the processing fluid itself is increased to realize a supercritical state. This eliminates the need for heating from outside, making it possible to encourage reduction in consumed energy.

In this case, in the first step, the processing fluid in a gas phase lower in temperature than the critical temperature of the processing fluid can be introduced into the chamber, for example. By doing so, the temperature of the flow passage of the processing fluid and that of the chamber themselves can be controlled to be equal to or less than the critical temperature. This makes it possible to avoid temperature increase of the processing fluid and transition of the processing fluid to a supercritical state in subsequent introduction of a liquid phase.

On the other hand, in the second step, the pressure of the processing fluid higher in temperature than the critical temperature of the processing fluid may be increased to be equal to or greater than a critical pressure to bring the processing fluid into a supercritical state, for example. This configuration reliably prevents the processing fluid from being changed from a gas phase to a liquid phase in the second step. Thus, the problems resulting from formation of a gas-liquid interface are avoided before they occur.

As another example, the third step may be configured to supply the processing fluid in a liquid phase from outside into the chamber filled with the processing fluid in a supercritical state. The processing fluid in a liquid phase is lower in temperature than the processing fluid in a supercritical state. Introducing the processing fluid in a liquid phase into the chamber from outside allows the processing fluid (in a supercritical state) in the chamber to be reduced in temperature and to be liquefied. Specifically, the chamber can readily be filled with the processing fluid in a liquid phase, thereby encouraging shortening of processing time.

Further in this case, in the third step, the processing fluid in a liquid phase supplied into the chamber may be discharged at least partially from the chamber, for example. In this configuration, discharging the processing fluid containing a dissolved liquid having adhered to the substrate makes it possible to prevent a liquid component from remaining in the chamber.

As another example, in the fourth step, the processing fluid in the chamber may be changed from a liquid phase to a supercritical state by increasing the temperature of the processing fluid. If the processing fluid having made transition from a supercritical state to a liquid phase is maintained at a high pressure, the processing fluid can make transition to a supercritical state again only by increasing the temperature of the processing fluid.

As another example, the fifth step may be configured to reduce the pressure of the processing fluid to be equal to or less than the critical pressure while the processing fluid is maintained at a temperature equal to or greater than the critical temperature. This configuration allows the processing fluid to be changed from a supercritical state to a gas phase without intervention of a liquid phase. Thus, a gas-liquid interface is not formed during the course of removal of the processing fluid. This makes it possible to avoid problems such as contamination of the substrate, pattern collapse, etc. resulting from formation of a gas-liquid interface.

As another example, the liquid may be an organic solvent and the processing fluid may be carbon dioxide. Carbon dioxide is a fluid to be brought into a supercritical state under conditions of a temperature and a pressure relatively close to ordinary temperature and ordinary pressure. Additionally, carbon dioxide is highly soluble in an organic solvent frequently used in a substrate process. Thus, carbon dioxide is preferably available for a supercritical process like the process of the present invention.

A substrate processing apparatus usable to perform the substrate processing method according to the present invention includes: a chamber to house a substrate; a fluid supplier configured to supply a processing fluid in a gas phase and a high-pressure processing fluid that is the processing fluid at a higher pressure than a critical pressure of the processing fluid to the chamber; a pipe through which the high-pressure processing fluid is passed from the fluid supplier to the chamber; a buffer interposed in the pipe and in which the high-pressure processing fluid output from the fluid supplier is stored temporarily; an open/close part interposed in the pipe between the buffer and the chamber and used for opening and closing a flow passage of the high-pressure processing fluid extending from the buffer to the chamber; and a controller that controls the fluid supplier and the open/close part and causes the fluid supplier to supply the high-pressure processing fluid in a liquid phase to the buffer while the open/close unit closes the flow passage, thereby bringing the high-pressure processing fluid in the flow passage into a supercritical state through adiabatic compression, for example.

In the substrate processing apparatus of the above-described configuration, by flowing the high-pressure processing fluid into the buffer while closing the output side of the buffer, a processing fluid in a supercritical state can be generated from a processing fluid in a liquid phase using adiabatic compression, for example. This makes it possible to realize transition from a gas phase to a liquid phase with intervention of a supercritical state in the above-described substrate processing method of the present invention without involving large consumption of energy.

Further in this case, a heater interposed between the buffer and the open/close part and configured to heat the high-pressure processing fluid to a temperature equal to or greater than a critical temperature may further be provided. This configuration can readily make transition of the high-pressure processing fluid again to a supercritical state after the processing fluid makes transition from a supercritical state to a liquid phase.

INDUSTRIAL APPLICABILITY

The present invention is applicable to every type of substrate processing apparatus that processes a substrate using a supercritical fluid. In particular, the present invention is preferably applicable to a substrate drying process of drying a substrate such as a semiconductor substrate with a supercritical fluid.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

REFERENCE SIGNS LIST 1 substrate processing apparatus
12 processing chamber (chamber)
57 fluid supplier
90 control unit (controller)
211 pipe
213 buffer unit
215 heater
216 valve (open/close part)
S substrate
S104 first step
S105 second step
S106 third step
S107 fourth step
S108 fifth step

The invention claimed is:

1. A substrate processing method for drying a substrate by replacing a liquid adhering to the substrate with a processing fluid in a supercritical state, the substrate processing method comprising:
   introducing the processing fluid in a gas phase into a chamber housing the substrate;
   after introducing the processing fluid in the gas phase into the chamber housing the substrate, changing the processing fluid in the chamber from the gas phase to a supercritical state without intervention of a liquid phase;
   after changing the processing fluid in the chamber from the gas phase to the supercritical state without intervention of the liquid phase, changing the processing fluid in the chamber from the supercritical state to a liquid phase;
   after changing the processing fluid in the chamber from the supercritical state to the liquid phase, changing the processing fluid in the chamber from the liquid phase to the supercritical state; and
   after changing the processing fluid in the chamber from the liquid phase to the supercritical state, changing the processing fluid that was changed from the liquid phase to the supercritical state in the chamber from the supercritical state to the gas phase without intervention of a liquid phase and discharging the processing fluid from the chamber.

2. The substrate processing method according to claim 1, wherein in changing the processing fluid from the gas phase to the supercritical state, the processing fluid lower in temperature than a critical temperature of the processing fluid is brought into the supercritical state by being adiabatically compressed.

3. The substrate processing method according to claim 2, wherein in introducing the processing fluid into the chamber, the processing fluid in the gas phase lower in temperature than a critical temperature of the processing fluid is introduced into the chamber.

4. The substrate processing method according to claim 1, wherein in changing the processing fluid from the gas phase to the supercritical state, pressure of the processing fluid higher in temperature than a critical temperature of the processing fluid is increased to be equal to or greater than a critical pressure to bring the processing fluid into the supercritical state.

5. The substrate processing method according to claim 1, wherein in changing the processing fluid from the supercritical state to the liquid phase, the processing fluid in the liquid phase is supplied from outside into the chamber filled with the processing fluid in the supercritical state.

6. The substrate processing method according to claim 5, wherein in changing the processing fluid from the supercritical state to the liquid phase, the processing fluid in the liquid phase supplied into the chamber is discharged at least partially from the chamber.

7. The substrate processing method according claim 1, wherein in changing the processing fluid from the liquid phase to the supercritical state, the processing fluid in the chamber is changed from the liquid phase to the supercritical state by increasing temperature of the processing fluid.

8. The substrate processing method according to claim 1, wherein in changing the processing fluid from the supercritical state to the gas phase, pressure of the processing fluid is reduced to be equal to or less than a critical pressure while the processing fluid is maintained at a temperature equal to or greater than a critical temperature.

9. The substrate processing method according claim 1, wherein the liquid is an organic solvent and the processing fluid is carbon dioxide.

10. A substrate processing apparatus to perform drying a substrate by replacing a liquid adhering to the substrate with a processing fluid in a supercritical state, the substrate processing apparatus comprising:

a chamber which houses a substrate;

a fluid supplier which is capable supplying a processing fluid in a gas phase and a high-pressure processing fluid that is the processing fluid at a higher pressure than a critical pressure of the processing fluid to the chamber;

a pipe through which the high-pressure processing fluid is passed from the fluid supplier to the chamber;

a buffer which is interposed in the pipe and in which the high-pressure processing fluid output from the fluid supplier is stored temporarily;

an open/close part which is interposed in the pipe between the buffer and the chamber and which opens and closes a flow passage of the high-pressure processing fluid from the buffer to the chamber; and a controller which controls the fluid supplier and the open/close part, wherein the controller is configured to execute the substrate processing method according to claim 1.

11. The substrate processing apparatus according to claim 10, further comprising a heater which is interposed between the buffer and the open/close part and heats the high-pressure processing fluid to a temperature equal to or greater than a critical temperature.

* * * * *